US010633739B2

(12) United States Patent
Hirochi et al.

(10) Patent No.: US 10,633,739 B2
(45) Date of Patent: Apr. 28, 2020

(54) SUBSTRATE PROCESSING APPARATUS

(71) Applicant: KOKUSAI ELECTRIC CORPORATION, Tokyo (JP)

(72) Inventors: Yukitomo Hirochi, Toyama (JP); Takashi Yahata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/262,382

(22) Filed: Jan. 30, 2019

(65) Prior Publication Data

US 2020/0087785 A1    Mar. 19, 2020

(30) Foreign Application Priority Data

Sep. 14, 2018  (JP) ................................. 2018-172705

(51) Int. Cl.
| | | |
|---|---|---|
| *C23C 16/455* | (2006.01) | |
| *C23C 16/458* | (2006.01) | |
| *H01L 21/67* | (2006.01) | |
| *C23C 16/52* | (2006.01) | |

(52) U.S. Cl.
CPC .... *C23C 16/45538* (2013.01); *C23C 16/4584* (2013.01); *C23C 16/45544* (2013.01); *C23C 16/45553* (2013.01); *C23C 16/45565* (2013.01); *C23C 16/52* (2013.01); *H01L 21/67017* (2013.01)

(58) Field of Classification Search
CPC .................................... C23C 16/45536–45542
See application file for complete search history.

(56) References Cited

U.S. PATENT DOCUMENTS

| | | | |
|---|---|---|---|
| 9,018,689 B1 | 4/2015 | Hirochi et al. | |
| 2001/0010207 A1 | 8/2001 | Yamamoto et al. | |
| 2001/0029891 A1* | 10/2001 | Oh .................... | C23C 16/403 118/722 |
| 2002/0069827 A1 | 6/2002 | Sakamoto et al. | |
| 2007/0087579 A1* | 4/2007 | Kitayama ........... | C23C 16/4405 438/778 |

(Continued)

FOREIGN PATENT DOCUMENTS

| | | |
|---|---|---|
| JP | 2001-168083 A | 6/2001 |
| JP | 2002-100623 A | 4/2002 |

(Continued)

*Primary Examiner* — Dah-Wei D. Yuan
*Assistant Examiner* — Stephen A Kitt
(74) *Attorney, Agent, or Firm* — Volpe & Koenig, P.C.

(57) ABSTRACT

A substrate processing apparatus includes: a process chamber in which a substrate is processed; a substrate support configured to support the substrate in the process chamber; a plurality of reaction gas supply holes formed in a wall of the process chamber opposite to a substrate mounting surface of the substrate support; a reaction gas supply pipe that is fixed to the process chamber and communicates to each of the reaction gas supply holes; a plurality of reaction gas suppliers, each including a plasma generator installed on an upstream side of the reaction gas supply pipe; a plasma controller that is connected to the plasma generator and is configured to individually control a plurality of plasma generators; and a controller configured to control the substrate support, the plurality of reaction gas suppliers, and the plasma controller.

20 Claims, 5 Drawing Sheets

(56) References Cited

U.S. PATENT DOCUMENTS

| | | | | |
|---|---|---|---|---|
| 2009/0314309 A1* | 12/2009 | Sankarakrishnan | ...... | B08B 5/00 |
| | | | | 134/1.1 |
| 2012/0171852 A1* | 7/2012 | Yuan | ...... | C23C 16/24 |
| | | | | 438/488 |
| 2018/0076063 A1* | 3/2018 | Nakayama | ...... | C23C 16/45542 |

FOREIGN PATENT DOCUMENTS

| | | |
|---|---|---|
| JP | 2008-177194 A | 7/2008 |
| JP | 2015-144225 A | 8/2015 |

\* cited by examiner

SUBSTRATE PROCESSING APPARATUS

CROSS-REFERENCE TO RELATED APPLICATION

This application is based upon and claims the benefit of priority from Japanese Patent Application No. 2018-172705, filed on Sep. 14, 2018, the entire contents of which are incorporated herein by reference.

TECHNICAL FIELD

The present disclosure relates to a substrate processing apparatus.

BACKGROUND

A semiconductor manufacturing apparatus for manufacturing a semiconductor device requires improvement in productivity. To this end, a substrate is uniformly processed to increase a yield.

As a method for processing a substrate, there is a method using plasma. Plasma has high energy and is, for example, used to cause a reaction between a film on a substrate and a precursor. In the related art, an apparatus using plasma is disclosed.

Such an apparatus may need to control an amount of radicals supplied in a radial direction of a substrate due to various restrictions.

SUMMARY

Some embodiments of the present disclosure provide a technique capable of controlling an amount of radicals supplied in a radial direction of a substrate in a substrate processing apparatus using plasma.

According to one embodiment of the present disclosure, there is provided a technique including: a process chamber in which a substrate is processed; a substrate support configured to support the substrate in the process chamber; a plurality of reaction gas supply holes formed in a wall of the process chamber opposite to a substrate mounting surface of the substrate support; a reaction gas supply pipe that is fixed to the process chamber and communicates to each of the reaction gas supply holes; a plurality of reaction gas suppliers, each including a plasma generator installed on an upstream side of the reaction gas supply pipe; a plasma controller that is connected to the plasma generator and is configured to individually control a plurality of plasma generators; and a controller configured to control the substrate support, the plurality of reaction gas suppliers, and the plasma controller.

DETAILED DESCRIPTION

Figure 1:
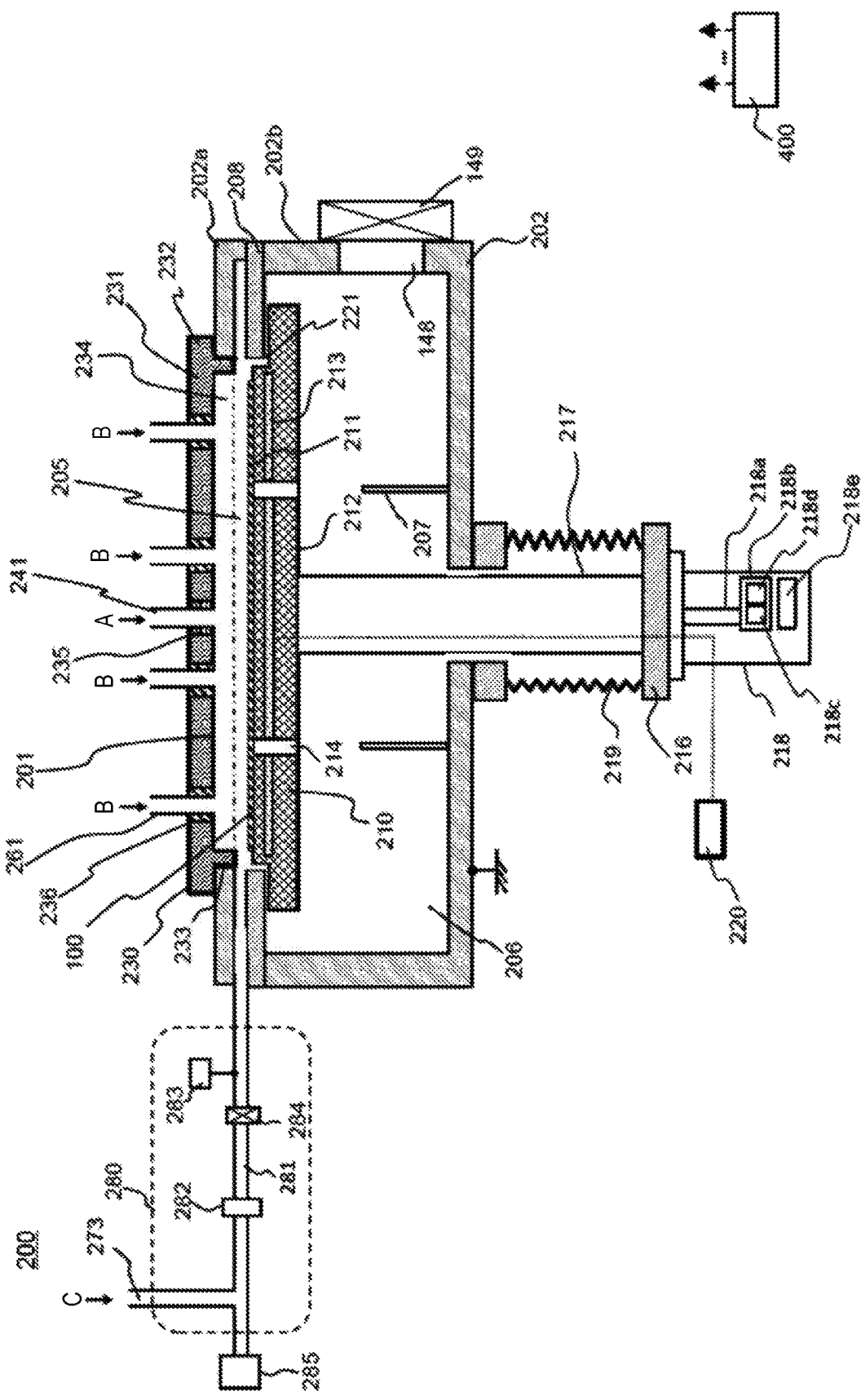
FIG. 1 is an explanatory view for explaining a substrate processing apparatus.

An embodiment of a substrate processing apparatus 200 for processing a substrate by supplying a plasma will now be described with reference to FIG. 1.

(Chamber)

The substrate processing apparatus 200 includes a chamber 202. The chamber 202 has, for example, a circular cross section and is configured as a flat closed container. The chamber 202 is made of a metal material such as aluminum (Al) or stainless steel (SUS). A processing space 205 for processing a substrate 100 such as a silicon wafer and a transfer space 206 through which the substrate 100 passes when the substrate 100 is transferred into the processing space 205 are formed in the chamber 202. The chamber 202 is composed of an upper container 202a and a lower container 202b. A partition plate 208 is installed between the upper container 202a and the lower container 202b.

A substrate loading/unloading port 148 adjacent to a gate valve 149 is installed on a side surface of the lower container 202b. The substrate 100 is moved into/out of a vacuum transfer chamber (not shown) through the substrate loading/unloading port 148. A plurality of lift pins 207 are installed at a bottom of the lower container 202b. The lower container 202b is grounded.

A process chamber 201 constituting the processing space 205 includes, for example, a substrate mounting stand 212 and a shower head 230, which will be described later. A substrate support 210 for supporting the substrate 100 is installed in the processing space 205. The substrate support 210 mainly includes a substrate mounting surface 211 on which the substrate 100 is mounted, the substrate mounting stand 212 having the substrate mounting surface 211 on its surface, and a heater 213 as a heating source incorporated in the substrate mounting stand 212.

Through-holes 214 through which the lift pins 207 penetrates are formed in the substrate mounting stand 212 at positions corresponding to the lift pins 207, respectively. A temperature controller 220 for controlling a temperature of the heater 213 is connected to the heater 213.

The substrate mounting stand 212 is supported by a shaft 217. The support part of the shaft 217 penetrates a hole formed in the bottom wall of the chamber 202 and is connected to a elevating rotation part 218 outside the chamber 202 through a support plate 216. By operating the elevating rotation part 218 to raise and lower the shaft 217 and the substrate mounting stand 212, it is possible to raise and lower the substrate 100 mounted on the substrate mounting surface 211. Further, by operating the elevating rotation part 218, it is possible to rotate the substrate mounting stand 212. A periphery of a lower end of the shaft 217 is covered with a bellows 219. The interior of the chamber 202 is kept airtight.

The elevating rotation part 218 mainly includes a support axis 218a for supporting the shaft 217 and an actuation part 218b for elevating or rotating the support axis 218a. The actuation part 218b includes, for example, an elevation part 218c including a motor for elevation and a rotation mechanism 218d such as a gear for rotating the support axis 218a. These components are coated with grease or the like for smooth operation.

As a portion of the elevating rotation part 218, an instruction part 218e for instructing the actuation part 218b for elevation/rotation may be installed in the elevating rotation part 218. The instruction part 218e is electrically connected to a controller 400. The instruction part 218e controls the actuation part 218b based on an instruction from the controller 400. The actuation part 218b controls the substrate mounting stand 212 so that it is moved to a wafer transfer position or a wafer processing position, as will be described later.

When the substrate 100 is transferred, the substrate mounting stand 212 is lowered to a position at which the substrate mounting surface 211 faces the substrate loading/unloading port 148. When the substrate 100 is processed, the substrate mounting stand 212 is raised up to the processing position of the substrate 100 in the processing space 205, as shown in FIG. 1.

The shower head 230 is installed on an upper portion (upstream side) of the processing space 205. The shower head 230 includes a lid 231. The lid 231 includes a flange 232 supported on the upper container 202a. Further, the lid 231 includes a positioning part 233. When the positioning part 233 fits to the upper container 202a, the lid 231 is fixed.

The shower head 230 includes a buffer space 234. The buffer space 234 refers to a space formed by the lid 231 and the positioning part 232. The buffer space 234 and the processing space 205 communicate to each other. A gas supplied into the buffer space 234 diffuses in the buffer space 234 and is uniformly supplied into the processing space 205. Here, the buffer space 234 and the processing space 205 are separate from each other. However, the present disclosure is not limited thereto. The buffer space 234 may be included in the processing space 205.

(Supplier)

The lid 231 is formed with a first gas supply hole 235 through which a precursor gas or a purge gas is supplied, and a second gas supply hole 236 through which a reaction gas is supplied. As will be described later, the reaction gas is a gas that reacts with the precursor gas. A plurality of second gas supply holes 236 are formed in a radial direction in order to allow the reaction gas to be supplied to an edge of the substrate 100. The second gas supply hole 236 is also referred to as a reaction gas supply hole.

The first gas supply hole 235 communicates to a common gas supply pipe 241 which is a portion of a first gas supplier 240. The common gas supply pipe 241 is fixed to a ceiling 231.

Each second gas supply hole 236 communicates to a reaction gas supply pipe 261 which is a portion of a second gas supplier 260. The reaction gas supply pipe 261 is fixed to the ceiling 231.

Figure 2:
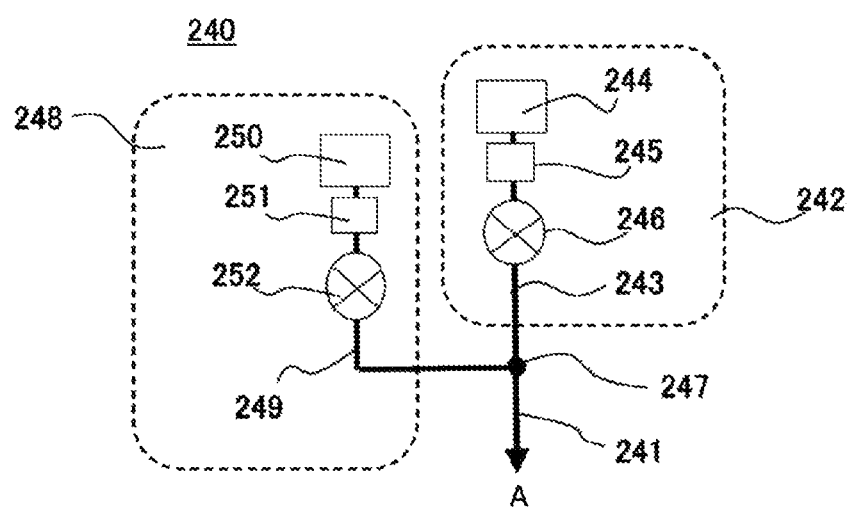
FIG. 2 is an explanatory view for explaining a first gas supplier.

A symbol "A" in FIG. 1 communicates to a symbol "A" in FIG. 2. A symbol "B" in FIG. 1 communicates to a symbol "B" in FIG. 3.

At least a central axis of the second gas supply hole 236 is not coaxial with a central axis of the substrate 100. By making both the central axes deviate from each other and rotating the substrate 100, the reaction gas in a plasma state can be evenly supplied to a surface of the substrate 100.

(First Gas Supplier)

Subsequently, the first gas supplier 240 will be described in detail with reference to FIG. 2. A first gas supply pipe 243 and a purge gas supply pipe 249 are connected to the common gas supply pipe 241.

A first element-containing gas is mainly supplied from the first gas supply pipe 243, and a purge gas is supplied from the purge gas supply pipe 249.

(Precursor Gas Supplier 242)

The first gas supply pipe 243 is connected to the common gas supply pipe 241. A first gas supply source 244, an MFC 245 which is a flow rate controller (flow rate control part), and a valve 246 which is an opening/closing valve, are installed in the first gas supply pipe 243 in order from the upstream side.

A gas containing first element (hereinafter referred to as a "first element-containing gas") is supplied from the first gas supply pipe 243 into the shower head 230 via the mass flow controller 245, the valve 246 and the common gas supply pipe 241.

The first element-containing gas is one of precursor gases, that is, processing gases. Here, the first element is, for example, silicon (Si). That is, the first element-containing gas is, for example, a silicon-containing gas. Specifically, a dichlorosilane ($SiH_2Cl_2$, also called DCS) gas is used as the silicon-containing gas.

When the first element-containing gas is a liquid at the normal temperature and normal pressure, a vaporizer (not shown) may be installed between the first gas supply source 244 and the MFC 245. Here, the first element-containing gas will be described as a gas.

A first element-containing gas supply system 242 (also referred to as a silicon-containing gas supply system) is mainly constituted by the first gas supply pipe 243, the MFC 245 and the valve 246.

The first gas supply source 244 may be included in the first element-containing gas supply system 242.

(Purge Gas Supplier)

A downstream end of the purge gas supply pipe 249 which is a portion of a purge gas supplier 248 is connected to a junction portion 247 of the common gas supply pipe 241 and the first gas supply pipe 243. A purge gas supply source 250, an MFC 251 which is a flow rate controller (flow rate control part), and a valve 252 which is an opening/closing valve, are installed in the purge gas supply pipe 249 in order from the upstream side.

The purge gas is used to purge an internal atmosphere of the processing space 205 in a purging process to be described later. For example, a nitrogen gas is used as the purge gas.

The purge gas supplier 248 is mainly constituted by the purge gas supply pipe 249, the MFC 251 and the valve 252.

The purge gas supply source 250 may be included in the purge gas supplier 248.

(Second Gas Supplier)

Figure 3:
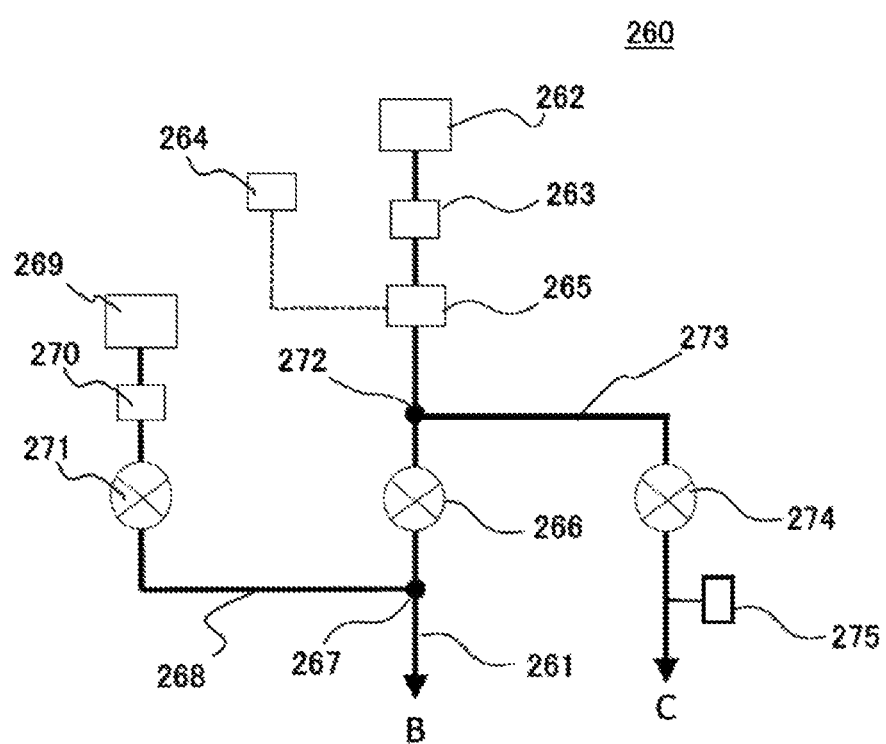
FIG. 3 is an explanatory view for explaining a second gas supplier.

Subsequently, the second gas supplier 260 will be described with reference to FIG. 3. A reaction gas supply source 262, an MFC 263 which is a flow rate controller (flow rate control part), a remote plasma unit (RPU) 265 which is a plasma generator, and a valve 266, are installed in each reaction gas supply pipe 261 in order from the upstream side.

Then, a reaction gas is supplied from the reaction gas supply pipe 261 into the shower head 230 via the MFC 263 and the RPU 265. The reaction gas is brought into a plasma state by the RPU 265. The RPU 265 is controlled by a plasma controller 264.

Each RPU 265 can be controlled individually. As a control method, for example, a plurality of plasma controller 264 corresponding respectively to a plurality of RPUs 265 may be installed and may control the respective RPUs. Further, one plasma controller 264 may be connected to a plurality of RPUs 265 and may control the RPUs 265 individually.

As the control of the RPU 265, for example, power to be supplied to the RPU 265 is controlled. By controlling the power, the amount of radicals to be generated can be adjusted. For example, higher power generates more radicals, whereas lower power generates fewer radicals.

The reaction gas is one of the processing gases and is, for example, a nitrogen-containing gas. For example, an ammonia ($NH_3$) gas is used as the nitrogen-containing gas.

The downstream end of an inert gas supply pipe 268 is connected to a junction portion 267 on the downstream side of the valve 266. An inert gas supply source 269, an MFC 270 which is a flow rate controller (flow rate control pan), and a valve 271 which is an opening/closing valve, are installed in the inert gas supply pipe 268 in order from the upstream side. An inert gas is supplied from the inert gas supply pipe 268 into the shower head 230 via the MFC 270, the valve 271 and the reaction gas supply pipe 261. The inert gas is, for example, a nitrogen ($N_2$) gas.

In the present embodiment, since there is no dispersion plate described in the related art, the inert gas is supplied to the substrate 100 without being deactivated in the shower head 230.

The inert gas supplied from the inert gas supply pipe 268 serves as a gas curtain so that a precursor gas and a purge gas do not intrude into the reaction gas supply pipe 261.

A junction portion 272 and the valve 266 are installed between the RPU 265 and the junction portion 267. A bypass pipe 273 is connected to the junction portion 272. A valve 274 and a plasma monitor 275 are installed in the bypass pipe 273. The downstream side of the bypass pipe 273 is connected to an exhaust pipe 281 to be described later, so that the internal atmosphere of the bypass pipe 273 can be exhausted.

The second gas supplier 260 is mainly constituted by the reaction gas supply pipe 261, the MFC 263, the valve 266, the RPU 265, the inert gas supply pipe 268, the MFC 269, the valve 271, the bypass pipe 273 and the valve 274. Since the second gas supplier 260 is configured to supply a reaction gas, it is also referred to as a reaction gas supplier.

The reaction gas supply source 262, the inert gas supply source 269 and the plasma monitor 275 may be included in the second gas supplier 260.

In the second gas supplier 260, the valve 266 is referred to as a first valve, the valve 271 is referred to as a second valve, and the valve 274 is referred to as a third valve.

Here, as a comparative example related to plasma generation, a structure for generating plasma at the ceiling of the process chamber will be described. Specifically, in this structure, a plasma generator such as an electrode is embedded in the ceiling of a process chamber, a plasma generation chamber also serving as a supply hole is formed adjacent thereto, and plasma is generated when a gas passes through the ceiling. With such a structure, when plasma is generated, there is a concern that the wall of the plasma generation chamber will be etched and so there is a concern that etched substances may adhere to a substrate. In the case of a structure in which a plurality of plasma generation chambers are installed on the ceiling, the amount of etched substances increases depending on the number of plasma generation chambers, which may result in significant decrease in yield.

As a comparative example related to a method of supplying plasma, for example, there is a method of supplying plasma generated using one plasma generator in a dispersing manner using a gas guide and a dispersion plate in the related art.

In the related art, since a distance between the plasma generator and the substrate is long, it is difficult for the substrate to be affected by the etched substances, but it is conceivable that the plasma is deactivated by collision with the gas guide or the dispersion plate. As a result, since the amount of radicals decreases, there is a possibility that a desired film cannot be formed due to insufficient reaction or the like.

In particular, since an amount of deactivation increases as the plasma moves toward a leading end of the gas guide, an amount of plasma at the periphery of the substrate is smaller than that at the center of the substrate. That is, in addition to the reduction of radicals over the entire substrate, the amount of radicals differs between the center of the substrate and the periphery of the substrate. Therefore, processing varies between the center of the substrate and the periphery of the substrate.

As described above, in the present embodiment, since a plurality of RPUs 265 as plasma generators are installed outside the process chamber 201, the amount of radicals can be controlled in the radial direction of the substrate without being deactivated, as compared with the comparative example.

(Exhaust Part)

Returning to FIG. 1, an exhaust part 280 for exhausting the internal atmosphere of the process chamber 201 includes an exhaust pipe 281 communicating to the processing space 205. An APC (Auto Pressure Controller) 282 which is a pressure controller for controlling the interior of the processing space 205 to a predetermined pressure, and a pressure detection part 283 for measuring the pressure of the processing space 205, are installed in the exhaust pipe 281. The APC 282 includes a valve body (not shown) whose opening degree can be adjusted, and adjusts the conductance of the exhaust pipe 281 according to an instruction from the controller 400 to be described later. A valve 284 is installed in the exhaust pipe 281 on the upstream side of the APC 282. The bypass pipe 273 is connected to the downstream side of the APC 282. The exhaust pipe 281, the valve 284, the APC 282 and the pressure detection part 283 are collectively referred to as an exhaust part 280.

A pump 285 is installed on the downstream side of the exhaust pipe 281. The pump 285 exhausts the internal atmosphere of the process chamber 201 and the internal atmosphere of the bypass pipe 273 via the exhaust pipe 281.

(Controller)

Figure 4:
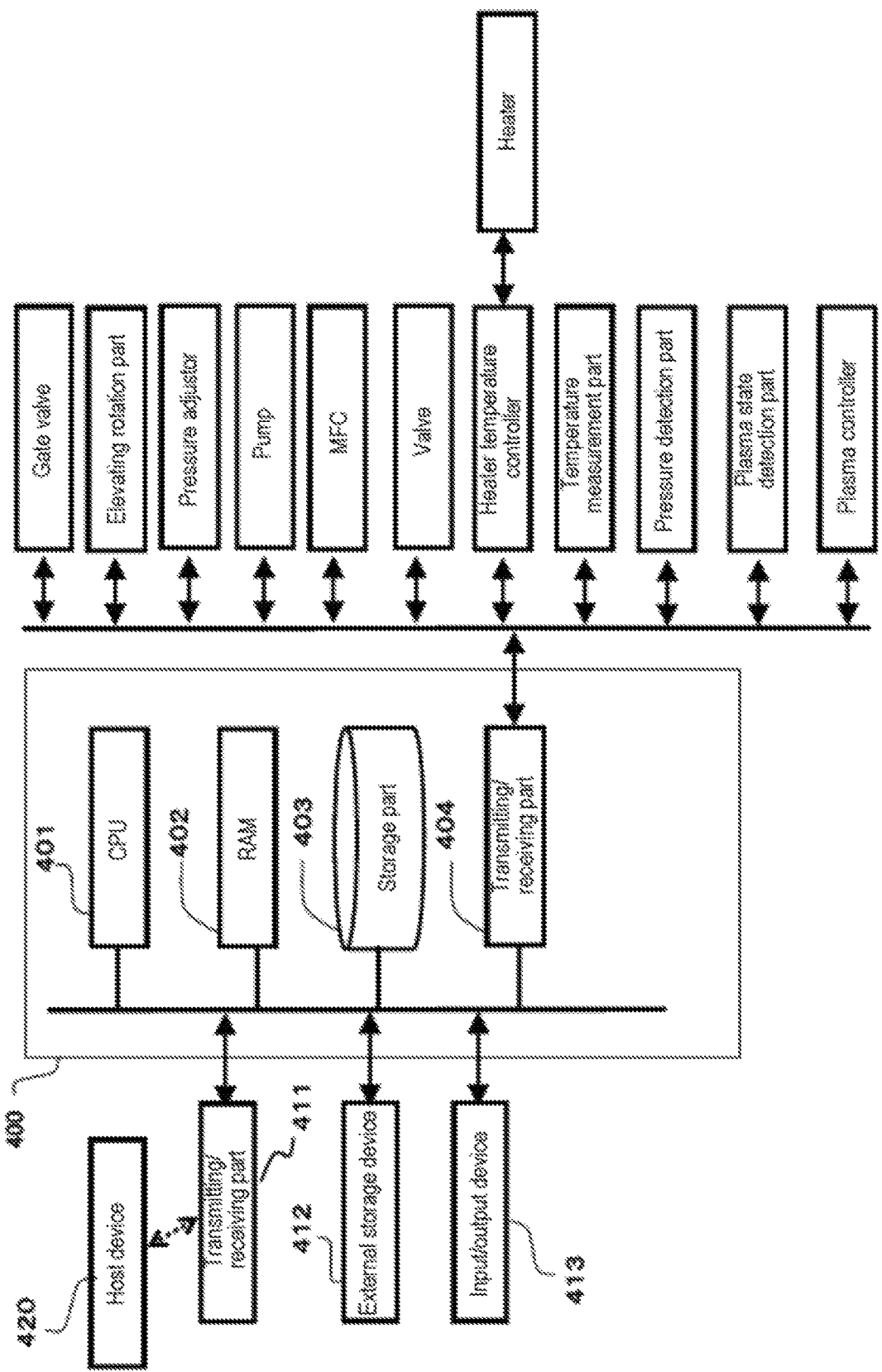
FIG. 4 is an explanatory view for explaining a controller of the substrate processing apparatus.

The substrate processing apparatus 200 includes a controller 400 that controls an operation of each part of the substrate processing apparatus 200. As shown in FIG. 4, the controller 400 at least includes an arithmetic operation part (CPU) 401, a temporary storage part 402, a storage part 403 and a transmitting/receiving part 404. The controller 400 is connected to each component of the substrate processing apparatus 200 via the transmitting/receiving part 404, calls a program or a recipe from the temporary storage part 402 in accordance with an instruction from an upper controller or a user, and performs the operation of each component in accordance with the contents of the program or the recipe. The controller 400 may be configured as a dedicated computer or as a general-purpose computer. For example, the controller 400 according to this embodiment can be configured by preparing an external storage device 412 (for example, a magnetic tape, a magnetic disk such as a flexible disk or a hard disk, an optical disk such as a CD or a DVD, a magneto optical disk such as an MO, or a semiconductor memory such as a USB memory (USB flash drive) or a memory card) that stores the above-mentioned program and installing the program in a general-purpose computer using the external storage device 412. The means for supplying the program to the computer is not limited to being supplied via the external storage device 412. For example, a communication means such as the Internet or a dedicated line may be used, or information may be received from a host device 420 via the transmitting/receiving part 411 and the program may be supplied without going through the external storage device 412. Further, the controller 400 may be instructed by using an input/output device 413 such as a keyboard or a touch panel.

The storage part 402 and the external storage device 412 are configured as a computer-readable recording medium. Hereinafter, these are collectively referred to simply as a recording medium. In the present disclosure, when the term "recording medium" is used, it may include the storage part 402 alone, the external storage device 412 alone, or both.

(Substrate Processing Process)

Figure 5:
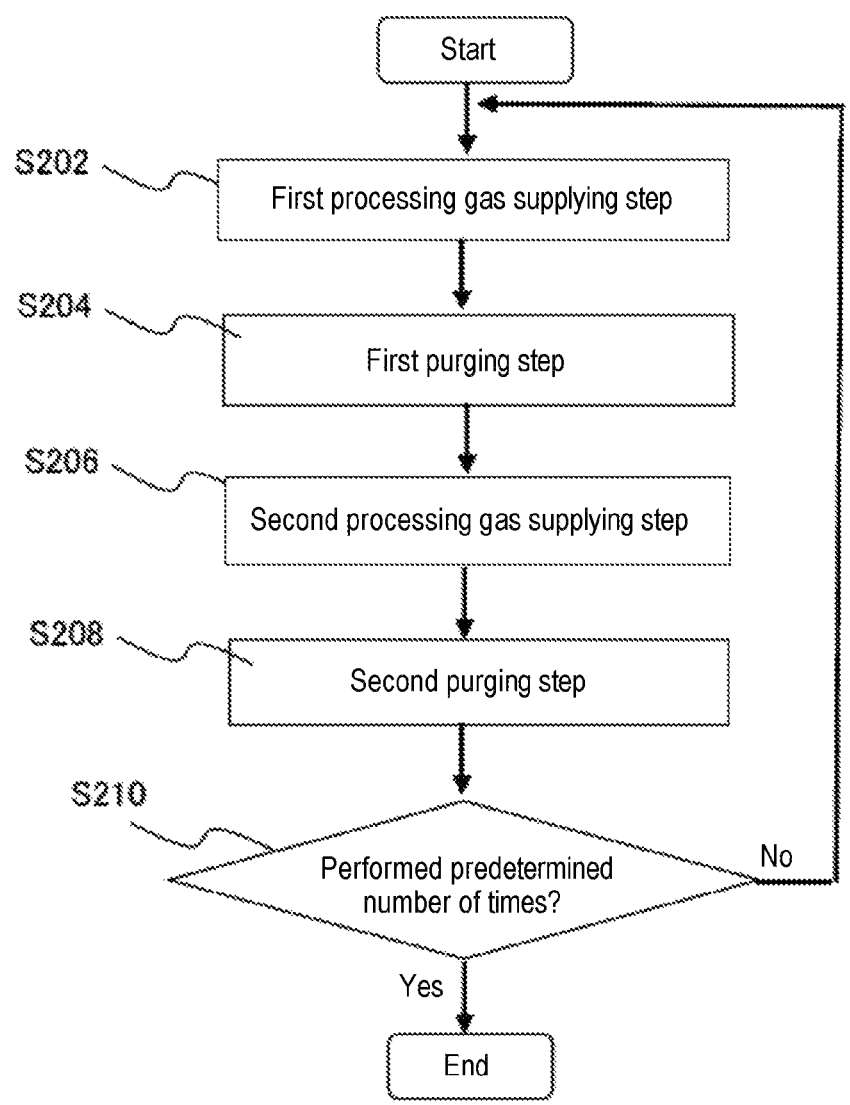
FIG. 5 is an explanatory view for explaining a substrate processing flow.

A substrate processing process using the substrate processing apparatus 200 will be described with reference to FIG. 5. By carrying out this substrate processing process, a thin film is formed on a substrate. In the following description, the operation of each part constituting the substrate processing apparatus 200 is controlled by the controller 400.

(Plasma Generator Adjusting Step)

A plasma generator adjusting step will be described. This step is not shown in FIG. 5. In the plasma generator adjusting step, power to be supplied to each RPU 265 is adjusted so as to cope with various restrictions.

Here, examples of the restrictions will be described. One example is a problem of individual difference between substrate processing apparatuses. The individual difference involves, for example, uniformity of plasma supply. Even when each MFC 263 is adjusted in the same manner, there is a case in which the amount of plasma supplied to the substrate surface varies in each substrate processing apparatus. This is caused by the precision of assembly and the nature of a component. The uniformity of plasma supply is, for example, uniformity of the supply amount of radicals.

In this embodiment, in order to eliminate the individual difference, the supply amount of plasma is adjusted by specifying a place where the supply amount of plasma is small in advance and applying high power to the RPU 246 corresponding to that place, so that the plasma can be uniformly supplied. Such individual adjustment allows plasma to be uniformly supplied to the substrate 100.

Another example of the restrictions is a state of the substrate. For example, when a substrate on which a metal such as an electrode is formed is to be processed, it is necessary to suppress the influence on the metal. Further, when there is a deviation in a thickness of a film formed on a loaded substrate or the like, the supply amount of radicals may be partially controlled so as to correct the deviation. In recent years, in order to process films of many kinds, substrates of different types have been sometimes processed by a single substrate processing apparatus. In order to deal with many types of substrate processing, plasma is controlled based on the types of substrates.

(Substrate Loading Step)

A substrate loading step will be described. This step is not shown in FIG. 5. In the substrate processing apparatus 200, by lowering the substrate mounting stand 212 to the transfer position of the substrate 100, the lift pins 207 are passed through the through-holes 214 of the substrate mounting stand 212. As a result, the lift pins 207 protrude by a predetermined height from the surface of the substrate mounting stand 212. Subsequently, the gate valve 149 is opened to communicate the transfer space 206 to the vacuum transfer chamber (not shown). Then, the substrate 100 is loaded from the transfer chamber into the transfer space 206 by using a wafer transfer device (not shown), and the loaded substrate 100 is transferred onto the lift pins 207. Thus, the substrate 100 is supported in a horizontal posture on the lift pins 207 protruding from the surface of the substrate mounting stand 212.

When the substrate 100 is loaded into the chamber 202, the wafer transfer device is retracted to the outside of the chamber 202, and the gate valve 149 is closed to hermetically seal the interior of the chamber 202. Thereafter, by raising the substrate mounting stand 212, the substrate 100 is mounted on the substrate mounting surface 211. In addition, by raising the substrate mounting stand 212, the substrate 100 is raised up to the substrate processing position in the processing space 205.

After the substrate 100 is loaded into the transfer space 206, the valve 284 is opened to communicate the processing space 205 to the APC 282. By adjusting the conductance of the exhaust pipe 263, the APC 282 controls the exhaust flow rate of the processing space 205 by the pump 285 to maintain the processing space 205 at a predetermined pressure (for example, high vacuum of $10^{-5}$ to $10^{-1}$ Pa).

When the substrate 100 is mounted on the substrate mounting stand 212, power is supplied to the heater 213 embedded in the substrate mounting stand 212 so that the surface of the substrate 100 has a predetermined temperature. The temperature of the substrate 100 is, for example, the room temperature or higher and 800 degrees C. or lower, or the room temperature or higher and 500 degrees C. or lower in some embodiments. At this time, the temperature of the heater 213 is adjusted by the controller 400 extracting a control value based on the temperature information detected by a temperature sensor (not shown) and controlling a degree of current conduction of the heater 213 by the temperature controller 220.

After the temperature of the substrate 100 is raised to a substrate processing temperature, the following substrate processing involving heating treatment is performed while keeping the substrate 100 at the predetermined temperature. That is, a processing gas is supplied into the chamber 202 from each gas supply pipe to process the substrate 100.

Hereinafter, an example in which a silicon nitride film is formed as a thin film on the substrate 100 using a dichlorosilane ($SiH_2Cl_2$, abbreviation: DCS) gas as the first processing gas and an ammonia ($NH_3$) gas as the second processing gas will be described. Here, an alternate supplying process is performed in which a step of alternately supplying different processing gases is performed.

(First Processing Gas Supplying Step S202)

Subsequently, a first processing gas supplying step S202 will be described. When the substrate mounting stand 212 is moved to the wafer processing position as shown in FIG. 1, the internal atmosphere of the process chamber 201 is exhausted through the exhaust pipe 281 to adjust the internal pressure of the process chamber 201. While adjusting the internal pressure to a predetermined pressure, the substrate 100 is heated to a predetermined temperature, for example, 500 degrees C. to 600 degrees C.

Subsequently, the operation of the first gas supplier 240 will be described. In the precursor gas supplier 242, the valve 246 is opened and the flow rate of a processing gas is adjusted by the MFC 245. In the purge gas supplier 248, the valve 252 is closed. According to such operation, a processing gas, for example, a DCS gas, is supplied from the common gas supply pipe 241 into the process chamber 201. The supplied DCS gas forms a silicon-containing layer on the substrate 100.

The operation of the second gas supplier 260 will be described. The plasma controller 264 supplies power to the RPU 265 so as to set a gas passing through the RPU 265 to a plasma state. Further, the flow rate of an inert gas is controlled by the MFC 270, and the valve 271 is opened. At this time, the valve 266 is closed and the valve 274 is opened.

According to such operation, the processing gas is supplied from the first gas supplier 240 into the processing space 205. Further, from the second gas supplier 260, a reaction gas in a plasma state is not supplied into the processing space 205, but an inert gas is supplied. Since the reaction gas is exhausted via the bypass pipe 273, it does not intrude into the processing space 205.

Here, the reason why the RPU 265 is operated despite the fact that this step is a step of supplying a precursor gas will be described. In the present embodiment, the substrate 100 is processed by the alternate supply method. In the alternate supply method, the first processing gas supplying step and a second processing gas supplying step, which will be described later, are alternately performed. In the second processing gas supplying step, a processing gas in a plasma state is supplied to the substrate.

In a single wafer processing apparatus, since the capacity of the process chamber 201 is small, each process can be switched in a short time, but it is conceivable that the on/off of the RPU 265 cannot follow the switching. Since it takes a time to stabilize plasma generation, even when the on/off of the RPU 265 can follow the switching, stable supply of plasma cannot be followed.

Therefore, while the RPU 265 continues to be operated, when a gas in a plasma state is supplied in this step, the processing gas reacts in the process chamber 201, causing a gas phase reaction. In this case, a film cannot be formed for a device pattern having a high aspect ratio such as a deep groove.

Therefore, in the present embodiment, the RPU 265 is operated while a gas is being supplied to the RPU 265. Further, the valve 266 is closed and the valve 274 is opened to exhaust the gas in the plasma state through the bypass pipe 273. In this manner, while generating stable plasma, a gas in the generated plasma state is prevented from being supplied into the process chamber.

Further, by supplying the inert gas into the process chamber 201 via the inert gas supply pipe 268, the DCS gas is prevented from intruding into the reaction gas supply pipe 261. This can prevent by-products from occurring due to reaction of a precursor gas and a reaction gas in the reaction gas supply pipe.

At this time, the plasma monitor 275 detects the state of plasma and transmits a result of the detection to the controller 400. The controller 400 reads the detection result to check whether or not the desired plasma has been generated. For example, the RPU may be operated before the substrate processing to detect the plasma state. When it is determined that the plasma state is a desired state, a film-forming process may be performed.

When it is determined by the controller that the detection state detected by the plasma monitor 275 is not a desired state, the controller may control the plasma controller 264 to bring the plasma state into the normal (desired) state. For example, when it is determined that the amount of radicals is small, higher power is supplied to the RPU 265.

In this manner, by detecting the plasma state in each bypass pipe 273 and controlling the RPU 265 corresponding to each bypass pipe 273 in accordance with the detected plasma state, it is possible to more stably control the amount of radicals supplied in the radial direction of the substrate.

With the lapse of a predetermined time, the valve 246 is closed to stop the supply of the DCS gas. In the second processing gas supplier 260, the valve 271 continues to be opened, the valve 266 continues to be closed, and the valve 274 continues to be opened.

(Purging Step S204)

Subsequently, a purging step S204 will be described. After the supply of the DCS gas is stopped, a purge gas is supplied from the purge gas supply pipe 249 to purge the internal atmosphere of the process chamber 201. Here, the valves 246 and 266 are closed, and the valves 252, 271 and 274 are opened.

The internal pressure of the process chamber 201 is controlled by the APC 282 to reach a predetermined pressure. Thus, a DCS gas, which could not be bonded to the substrate 100 in the first processing gas supplying step S202, is removed by the pump 285 from the process chamber 201 via the exhaust pipe 281.

In the purging step S204, in order to eliminate a DCS gas which could not adhere to the substrate 100 or remains in the process chamber 201 and the shower head buffer chamber 232, a large amount of purge gas are supplied to enhance an exhaust efficiency.

With the lapse of a predetermined time, the valve 252 is closed, and the purging process is terminated.

(Second Processing Gas Supplying Step S206)

Subsequently, a second processing gas supplying step S206 will be described. After the purging of the process chamber 201 is completed, the second processing gas supplying step S206 is subsequently performed. In the second gas supplier 260, the valve 266 is opened, the valves 274 and 271 are closed, and an NH$_3$ gas, which is a second element-containing gas as the second processing gas, is supplied into the process chamber 201 via the RPU 265 and the shower head 230. At this time, the MFC 263 is adjusted so that the flow rate of the NH$_3$ gas becomes a predetermined flow rate. The supply flow rate of the NH$_3$ gas is, for example, 1,000 to 10,000 sccm.

By closing the valve 271 to prevent an inert gas from entering the reaction gas supply pipe 261, it is possible to avoid collision between the inert gas and the reaction gas, thereby preventing deactivation of the plasma. Further, since the gas supply is switched while the RPU 265 continues to be operated, it is possible to generate stable plasma.

In the first gas supplier 240, the valve 246 is closed to prevent the DCS gas from being supplied into the processing space 205. Further, the valve 252 is closed to prevent a large amount of inert gas from being supplied.

The NH$_3$ gas in the plasma state in the RPU 265 is supplied into the process chamber 201 via the shower head 230. The supplied NH$_3$ gas reacts with a silicon-containing layer on the substrate 100. Then, the already formed silicon-containing layer is modified by the plasma of NH$_3$ gas. Thus, a silicon nitride layer (SiN layer), which is a layer containing a silicon element and a nitrogen element, is formed on the substrate 100.

After the lapse of a predetermined time from the start of the supply of the NH$_3$ gas, the valve 266 is closed to stop the supply of the NH$_3$ gas. The supply time of the NH$_3$ gas is, for example, 2 to 20 seconds.

Further, the substrate mounting stand 212 may be rotated in some embodiments. Plasma can be more uniformly supplied to the substrate surface by rotating the substrate 100 together with the substrate mounting stand 212. Further, as in the present embodiment, when the rotation axis of the substrate 100 and the supply hole 236 are decentered, it is possible to uniformly supply the plasma throughout the substrate without being concentrated on the central portion of the substrate.

(Purging Step S208)

Subsequently, a purging step S208 will be described. After the supply of the NH₃ gas is stopped, a purging step S208 similar to the above-described purging step S204 is performed. Since the operation of each part in the purging step S208 is the same as that in the above-described purging step S204, explanation thereof will not be repeated here.

(Determining Step S210)

Subsequently, a determination step S210 will be described. With one cycle of the first processing gas supplying step S202, the purging step S204, the second processing gas supplying step S206 and the purging step S208, the controller 400 determines whether or not this cycle has been performed a predetermined number of times (n times). When the cycle is performed a predetermined number of times, a SiN layer having a desired film thickness is formed on the substrate 100. When the cycle has been performed a predetermined number of times ("Yes" in S210), the process shown in FIG. 5 is ended.

(Substrate Unloading Step)

Subsequently, a substrate unloading step will be described. When the SiN layer having a desired film thickness is formed, the substrate mounting stand 212 is lowered to move the substrate 100 to the transfer position. Thereafter, the gate valve 149 is opened and the substrate 100 is unloaded from the chamber 202 by using an arm (not shown).

In the above embodiment, radicals are uniformly supplied in the second processing gas supplying step. Therefore, since a precursor formed on the substrate 100 can be uniformly modified, it is possible to form a layer having a uniform composition such as bonding degree and density in the layer. Further, by laminating such a layer in multiple stages, it is possible to form a dense film which is free of pinholes or the like.

It has been illustrated in the above embodiment that a silicon-containing gas is used as the first element-containing gas and a nitrogen-containing gas is used as the second element-containing gas. However, the present disclosure is not limited thereto, and a metal-containing gas and an oxygen-containing gas may be used.

Further, while the inert gas has been illustrated with the N₂ gas, the inert gas is not limited thereto but may be any gas as long as it does not react with the processing gas. For example, the inert gas may be a rare gas such as a helium (He) gas, a neon (Ne) gas or an argon (Ar) gas.

According to the present disclosure in some embodiments, it is possible to provide a technique capable of controlling the amount of radicals supplied in the radial direction of a substrate in a substrate processing apparatus using plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a process chamber in which a substrate is processed;
    a substrate support configured to support the substrate in the process chamber;
    a first gas supply hole, through which a precursor gas or a purge gas is supplied, formed in a first portion of a shower head opposite to a substrate mounting surface of the substrate support;
    a plurality of second gas supply holes, through which a reaction gas is supplied, formed in second portions of the shower head opposite to the substrate mounting surface;
    a first gas supply pipe fixed to the process chamber and including an end portion that is directly connected to the first gas supply hole;
    a plurality of second gas supply pipes that are fixed to the process chamber, each of the second gas supply pipes including:
        a first end portion that is directly connected to one of the second gas supply holes; and
        a second end portion that communicates to a reaction gas supply source;
    a plurality of reaction gas suppliers including a plurality of plasma generators, respectively, which are installed on upstream sides of the second gas supply pipes, respectively;
    a plasma controller that is connected to the respective plasma generators and is configured to individually control the plasma generators; and
    a controller configured to control the substrate support, the reaction gas suppliers, and the plasma controller.

2. The substrate processing apparatus of claim 1, wherein each of the reaction gas suppliers includes:
    an inert gas supply pipe junctioned to one of the second gas supply pipes between one of the plasma generators and the process chamber; and
    a bypass pipe connected to one of the second gas supply pipes between the one of the plasma generators and a junction portion at which the inert gas supply pipe is junctioned to the one of the second gas supply pipes.

3. The substrate processing apparatus of claim 2, wherein a plasma monitor is installed in the bypass pipe, and a plasma state detected by the plasma monitor is transmitted to the controller.

4. The substrate processing apparatus of claim 3, wherein, when it is determined that the plasma state detected by the plasma monitor is not a desired state, the controller controls the plasma controller corresponding to the plasma monitor so that the plasma state becomes the desired state.

5. The substrate processing apparatus of claim 4, wherein a first valve is installed in one of the second gas supply pipes and between a connection portion of the bypass pipe and the junction portion of the inert gas supply pipe,
    wherein a second valve is installed in the inert gas supply pipe, and
    wherein a third valve is installed in the bypass pipe.

6. The substrate processing apparatus of claim 5, wherein the process chamber communicates to a precursor gas supplier that supplies the precursor gas that reacts with the reaction gas,
    wherein, when the precursor gas is supplied from the precursor gas supplier, the controller is configured to open the second valve and the third valve and closes the first valve, and
    wherein, when the reaction gas is supplied from the reaction gas suppliers without supplying the precursor gas from the precursor gas supplier, the controller is configured to close the second valve and the third valve and opens the first valve.

7. The substrate processing apparatus of claim 6, wherein the process chamber communicates to a purge gas supplier that supplies the purge gas that purges an atmosphere of the process chamber,
- wherein, when the purge gas is supplied from the purge gas supplier, the controller is configured to open the second valve and the third valve and closes the first valve, and
- wherein, when the reaction gas is supplied from the reaction gas suppliers without supplying the purge gas from the purge gas supplier, the controller is configured to close the second valve and the third valve and opens the first valve.

8. The substrate processing apparatus of claim 5, wherein the process chamber communicates to a purge gas supplier that supplies the purge gas that purges an atmosphere of the process chamber,
- wherein, when the purge gas is supplied from the purge gas supplier, the controller is configured to open the second valve and the third valve and closes the first valve, and
- wherein, when the reaction gas is supplied from the reaction gas suppliers without supplying the purge gas from the purge gas supplier, the controller is configured to close the second valve and the third valve and opens the first valve.

9. The substrate processing apparatus of claim 3, wherein a first valve is installed in one of the second gas supply pipes and between a connection portion of the bypass pipe and the junction portion of the inert gas supply pipe,
- wherein a second valve is installed in the inert gas supply pipe, and
- wherein a third valve is installed in the bypass pipe.

10. The substrate processing apparatus of claim 9, wherein the process chamber communicates to a precursor gas supplier that supplies the precursor gas that reacts with the reaction gas,
- wherein, when the precursor gas is supplied from the precursor gas supplier, the controller is configured to open the second valve and the third valve and close the first valve, and
- wherein, when the reaction gas is supplied from the reaction gas suppliers without supplying the precursor gas from the precursor gas supplier, the controller is configured to close the second valve and the third valve and opens the first valve.

11. The substrate processing apparatus of claim 9, wherein the process chamber communicates to a purge gas supplier that supplies the purge gas that purges an atmosphere of the process chamber,
- wherein, when the purge gas is supplied from the purge gas supplier, the controller is configured to open the second valve and the third valve and closes the first valve, and
- wherein, when the reaction gas is supplied from the reaction gas suppliers without supplying the purge gas from the purge gas supplier, the controller is configured to close the second valve and the third valve and opens the first valve.

12. The substrate processing apparatus of claim 3, wherein the substrate support has a rotatable structure.

13. The substrate processing apparatus of claim 3, wherein the second gas supply holes are configured to be decentered from a center axis of the substrate.

14. The substrate processing apparatus of claim 2, wherein a first valve is installed in one of the second gas supply pipes and between a connection portion of the bypass pipe and the junction portion of the inert gas supply pipe,
- wherein a second valve is installed in the inert gas supply pipe, and
- wherein a third valve is installed in the bypass pipe.

15. The substrate processing apparatus of claim 14, wherein the process chamber communicates to a precursor gas supplier that supplies the precursor gas that reacts with the reaction gas,
- wherein, when the precursor gas is supplied from the precursor gas supplier, the controller is configured to open the second valve and the third valve and close the first valve, and
- wherein, when the reaction gas is supplied from the reaction gas suppliers without supplying the precursor gas from the precursor gas supplier, the controller is configured to close the second valve and the third valve and open the first valve.

16. The substrate processing apparatus of claim 14, wherein the process chamber communicates to a purge gas supplier that supplies the purge gas that purges an atmosphere of the process chamber,
- wherein, when the purge gas is supplied from the purge gas supplier, the controller is configured to open the second valve and the third valve and close the first valve, and
- wherein, when the reaction gas is supplied from the reaction gas suppliers without supplying the purge gas from the purge gas supplier, the controller is configured to close the second valve and the third valve and open the first valve.

17. The substrate processing apparatus of claim 14, wherein the substrate support has a rotatable structure.

18. The substrate processing apparatus of claim 14, wherein the second gas supply holes are configured to be decentered from a center axis of the substrate.

19. The substrate processing apparatus of claim 1, wherein the substrate support has a rotatable structure.

20. The substrate processing apparatus of claim 1, wherein the second gas supply holes are configured to be decentered from a center axis of the substrate.

* * * * *